(12) United States Patent
Sato et al.

(10) Patent No.: US 6,435,222 B1
(45) Date of Patent: Aug. 20, 2002

(54) METHOD AND APPARATUS FOR MANUFACTURING ELECTRONIC PARTS

(75) Inventors: Keiichi Sato, Suwa; Eiji Kanbe, Chino; Hideomi Urushido, Minowa-machi, all of (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/724,540

(22) Filed: Nov. 27, 2000

(30) Foreign Application Priority Data

Dec. 2, 1999 (JP) ............................................. 11-343132
Dec. 9, 1999 (JP) ............................................. 11-345985

(51) Int. Cl.⁷ ................................................. B21F 1/00
(52) U.S. Cl. ....................................................... 140/105
(58) Field of Search ........................................ 140/105

(56) References Cited

U.S. PATENT DOCUMENTS 5,027,866 A * 7/1991 Matsumoto ................. 140/105
5,826,628 A * 10/1998 Hamilton .................... 140/105

FOREIGN PATENT DOCUMENTS

JP             62-168615        *  7/1987        ................. 140/105

* cited by examiner

*Primary Examiner*—Lowell A. Larson
(74) *Attorney, Agent, or Firm*—Michael T. Gabrik

(57) ABSTRACT

A method and apparatus for manufacturing electronic parts in which leads can be accurately bent and maintenance operations are easy. Each electronic part so manufactured includes a resin mold section 2 with a built-in electronic device and leads projecting therefrom, and the manufacturing method comprises bending a first portion of each of leads 3 to form a first bent portion 3*d*, bending a second portion of the lead 3 to form a second bent portion, and pressing the lead from obliquely above to bend the lead in such a manner that a tip portion of the lead 3 is located at a bottom portion of a resin mold. In the first bending step, a V-shaped groove 3*c* is formed near a root of the lead 3, and in the second bending step, the V-shaped groove 3*c* is bent to form a second bent portion 3*e*.

20 Claims, 9 Drawing Sheets

METHOD AND APPARATUS FOR MANUFACTURING ELECTRONIC PARTS

BACKGROUND OF THE INVENTION

1. Field of the Invention

The present invention relates to a method and apparatus for manufacturing electronic parts, each of which comprises a lead frame and an electronic element, for example, a quartz resonator mounted thereon, and each being entirely molded using a sealing resin. More particularly, the present invention relates to the bending of leads of the electronic part in the manufacture thereof.

2. Background Art

FIGS. 6A and 6B are a perspective view of a quartz oscillator and an explanatory drawing of leads of the quartz oscillator respectively. The quartz oscillator 1 comprises a resin mold section 2 with a built-in electronic element and leads 3 projecting therefrom. The resin mold section 2 has recesses 2a formed in a bottom portion thereof for housing tip sides of the leads 3. The leads 3 are bent toward the bottom portion in such a manner as to enclose a side of the resin mold section 2, and have their tip portions housed in the recesses 2a. By folding the leads 3 toward the bottom portion of the resin mold section 2 in the above manner, the height H of the quartz oscillator 1, including the resin mold section 2 and the leads 3, is reduced to lessen the thickness and size of the quartz oscillator. The leads 3 are molded by means of three bending operations using progressive press dies.

FIG. 7 shows how the leads are bent during each bending operation. The letter "a" denotes a state prior to bending, and "b" shows that the first bending operation has bent a root portion of each of the leads 3 upward while bending a tip portion thereof downward. The letter "c" shows that the second bending operation has bent the root portion downward. Finally, the third bending operation bends the tip portion of the lead 3 toward the bottom portion to form it as shown in FIG. 6B.

FIG. 8 shows a pressing section (stage) for a second bending operation. This second bending stage comprises a die 11, a stripper plate 12, and a punch 13. The press bending operation is carried out by lowering the punch 13 while the leads 3 of the quartz oscillator 1 placed on the die 11 are fixedly pressed on the die 11 by means of the stripper plate 12.

In the second bending stage, a space at which the leads 3 are pressed between the stripper plate 12 and the die 11 (identified by "d" in the drawings) is small, thereby preventing the product from being sufficiently fixed. Thus, although the base portion of the lead 3 must be bent at an edge position of the die 11, the lead 3 is actually bent at a root thereof with respect to the resin mold section 2. If the third bending operation is performed in this state, a crevice C occurs in the root of the lead 3 with respect to the resin mold section 2 as shown in FIG. 9. In addition, if the lead is bent at the root in this manner, the height H of the entire quartz oscillator 1 increases and fails to meet a required quality.

FIG. 10 shows a pressing section (stage) for a third bending operation. The third bending stage employs a cam mechanism for avoiding spring back of the leads 3. The cam mechanism comprises cam drivers 21 provided on a punch plate side and cam levers 22 rotatably supported and provided on a die plate side. When the cam drivers 21 are lowered, tips of the cam drivers 21 engage with the cam levers 22 to rotationally move the cam levers 22 inward to bend the leads 3 inward.

The cam mechanism of the above described third bending stage avoids the spring back of the leads 3 but creates the following problems when electronic parts are mass-produced:

(1) The shapes of parts of the cam mechanism are so complicated that maintenance operations cannot be easily performed. The shapes of the cam levers 22 and the lever holders 23 are complicated, and in particular, the cam lever 22 cannot be easily shaped, so that fine adjustments are often required during replacement of these parts.

(2) Cam lever shafts 25 are thin (they are forced to be thin due to mechanical restraints) and weak. Further the shafts 25 are easily worn away because the shaft move freely and the cam levers 22 have a narrow and fixed rotational movement range. When the cam lever shafts 25 are worn away, the cam levers 22 may shift from their correct positions, resulting in inappropriate bending.

(3) The cam mechanism (the cam levers) is located on a lower die set side, so that scraps from the resin mold (package) fall into and interfere with the cam mechanism to affect bending accuracy. For example, scraps may be caught in the cam mechanism and may not fall further downward, so that one of the cam levers 22 is stopped at the position shown in the right of FIG. 10 and is prevented from rotational movement. Alternatively, if a large scrap is present in a portion A in FIG. 10, the corresponding cam lever 22 cannot be rotationally moved to a final position, thereby preventing the lead 3 from being bent to a predetermined position. The resin mold in this state is fed to the next step, where problems occur that the parts may be destroyed or the dies may be damaged.

SUMMARY OF THE INVENTION

It is an object of the present invention to provide a method and apparatus for manufacturing electronic parts so as to allow their leads to be accurately bent.

It is another object of the present invention to provide the method and apparatus for manufacturing electronic parts to enable easy maintenance operations.

In a method for manufacturing at least one electronic part according to one aspect of the present invention, each electronic part includes a resin mold section with a built-in electronic element and leads projecting therefrom. The method comprises a first step of forming a V-shaped groove near a root of each of the leads and a second step of pressing a tip side of each lead to bend that lead downward near the V-shaped groove. According to the present invention, since the V-shaped groove is formed near the root of each lead during the first step, a bending position for the second step is set at the position of the V-shaped groove, thereby enabling bending at an appropriate position. In addition, a tip side of the lead is pressed during the second step, so that stress exerted on the root of the lead can be lessened to prevent occurrence of a crevice.

According to another aspect of the invention, the V-shaped groove is formed to have a depth between about one-third and about one-half of a board thickness of the lead. The strength of the recess in the lead is thus retained.

According to another aspect of the invention, in the second step, the lead is bent so as not to close the V-shaped groove. Since the lead is bent at the second step so as not to close the V-shaped groove, a bending portion is set at the position of the V-shaped groove during subsequent bending steps, thereby enabling bending at an appropriate position.

In a method for manufacturing at least one electronic part according to another aspect of the present invention, each electronic part includes a resin mold section with a built-in electronic element and leads projecting therefrom. The method comprises a first step of bending a first portion of each lead to form a first bent portion, a second step of bending a second portion, which is different from the first portion, of each lead to form a second bent portion, and a third step of pressing each lead from obliquely above to bend the lead in such a manner that a tip portion of the lead having the first and second bent portions is located at a bottom portion of the resin mold section. Since the lead is pressed from obliquely above and bent in such a manner that a tip portion of the lead having the first and second bent portions is located at a bottom portion of the resin mold section, an angle $\alpha$ in FIG. 6B is secured and the tip of the lead is accurately bent toward a bottom portion of the electronic part.

According to another aspect of the invention, the first bent portion is formed while the lead is simultaneously inclined upward. By doing so, the first bent portion has an acute bending angle to allow the tip of the lead to be accurately bent toward the bottom portion of the electronic parts.

According to another aspect of the invention, the first bent portion is formed while the V-shaped groove is simultaneously formed near a root of the lead. When the root of the lead is bent, the bending is easy because the V-shaped groove has been formed in this position. In addition, the occurrence of a crevice can be prevented.

According to another aspect of the invention, the first bent portion is formed between the tip portion and an intermediate portion of the lead. When a neighborhood of the first bent portion is pressed downward to form the second bent portion, the pressed portion of the lead is sufficiently distant from a neighborhood of the root, so that a bending stress concentrates in the V-shaped groove formed at the first step, thereby allowing the lead to be accurately bent.

According to another aspect of the invention, the second bent portion is formed near the root of the lead. As such, the lead can be bent along a shape of the resin mold section of the electronic part.

In a method for manufacturing electronic parts according to another aspect of the present invention, each electronic part includes a resin mold section with a built-in electronic element and leads projecting therefrom. The method comprises the steps of bending a lead upward in a neighborhood of a root thereof while simultaneously bending a first portion of the lead to form a first bent portion, and pressing the lead from obliquely above to bend the lead with the first bent portion so that a tip of the lead is located at a bottom portion of the resin mold section.

According to another aspect of the invention, a neighborhood of a root of the lead is bent upward while a V-shaped groove is simultaneously formed near the root of the lead. The first bent portion has an acute bending angle to allow a tip of the lead to be accurately bent toward a bottom portion of the electronic part. When a neighborhood of the root of the lead is bent again, the bending is easy because the V-shaped groove has been formed in this position. In addition, the occurrence of a crevice can be prevented.

According to another aspect of the invention, the electronic part is a quartz oscillator. Thus, a thin quartz oscillator can be implemented.

An apparatus for manufacturing at least one electronic part according to another aspect of the present invention is also provided. Each electronic part comprises a resin mold section with a built-in electronic element and leads projecting therefrom. The apparatus comprises a first bending punch for bending a first portion of each lead to form a first bent portion, a first bending die formed in a fashion corresponding to the first bending punch, a second bending punch for bending a neighborhood of a root of the lead, a second bending die located in a fashion corresponding to the second bending punch, a cam driver for further bending the bent portion near the root, and a third bending punch formed in a fashion corresponding to the cam driver, the first bending die having a projection formed thereon to form a V-shaped groove near the root of the lead. Since the projection is formed on the first bending die for forming the first bent portion, the V-shaped groove can be formed near the root of the lead.

According to another aspect of the invention, a vertex of the projection has an angle set between 60° and 90°. As such, the V-shaped groove formed in the lead is sized so that it is not closed even after a neighborhood of the root of the lead has been bent, thereby enabling accurate bending when further bending the bent portion near the root.

In accordance with another aspect of the present invention, an apparatus for manufacturing at least one electronic part is provided. Each electronic part comprises a resin mold section with a built-in electronic element and leads projecting therefrom. The apparatus comprises a first bending punch for bending a first portion of each of the leads to form a first bent portion, a first bending die formed in a fashion corresponding to the first bending punch, a second bending punch for bending a second portion of the lead, which is different from the first portion, to form a second bent portion, a second bending die located in a fashion corresponding to the second bending punch, and a third bending punch for pressing the lead from obliquely above to bend it in such a manner that a tip portion of the lead having the first and second bent portions is located at a bottom portion of the resin mold section. Since the third bending punch is installed on an upper die, the apparatus is not substantially affected by scraps. Additionally, by setting an angle of an inner wall of the bending punch taking the amount of spring back of the lead into consideration, accurate bending is secured.

According to another aspect of the invention, the first bending punch and the first bending die are arranged so that the first bent portion is formed between the tip portion and an intermediate portion of the lead. Thereby, the first bent portion is formed.

According to another aspect of the invention, the second bending punch and the second bending die are arranged so as to form the second bent portion near a root of the lead. Thereby, the second bent portion is formed.

According to another aspect of the invention, the third bending punch has a curved surface portion brought in contact with the lead section, thereby avoiding the scratch on the lead surface.

According to another aspect of the invention, the first bending die has a projection formed therein for forming a V-shaped groove near the root of the lead. The projection of the first bending die forms the V-shaped groove.

According to another aspect of the invention, the projection has a height set between about one-third and about one-half of the thickness of the lead formed in the electronic parts, thereby retaining a strength of the V-shaped groove in the lead.

According to another aspect of the invention, the projection is formed so that its vertex has an angle between 60° and 90°. Thus, the groove in the lead is sized so that it is not closed even after the second bending portion has been formed, thereby enabling accurate bending when bending a tip of the lead toward a bottom side of the electronic part.

According to another aspect of the invention, the first and second bending dies are formed to contact at least partly with a neighborhood of the root of the lead. The bending dies are formed to contact with the neighborhood of the root of the lead, thereby allowing the lead to be stably bent.

According to another aspect of the invention, the manufacturing apparatus further comprises a cam driver for driving the third bending punch. Since the cam driver is mounted on an upper mold, the apparatus is hardly affected by scraps.

According to another aspect of the invention, the third bending punch has a surface inclined at a predetermined angle with respect to a vertical direction. This enables a sliding surface of the bending punch to be set wide, replacements of parts caused by biased abrasion is less frequently required, resulting in easy maintenance. In addition, since this structure requires no lever shaft contrary to the prior art, no part has an extremely short life time, also reducing the frequency of maintenance operations.

According to another aspect of the invention, the third bending punch is provided in a stripper plate via a spring member.

According to another aspect of the invention, each of the bending punches and each of the bending dies are formed, so as to bend leads formed in a major axis direction of the electronic part. The present invention is thus applicable to electronic parts having leads formed in the major axis direction.

According to another aspect of the invention, each of the bending punches and each of the bending dies are formed so as to bend leads formed in a minor axis direction of the electronic part. The present invention is thus applicable to electronic parts having leads formed in the minor axis direction.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts.

DESCRIPTION OF THE PREFERRED EMBODIMENTS

Figure 1:
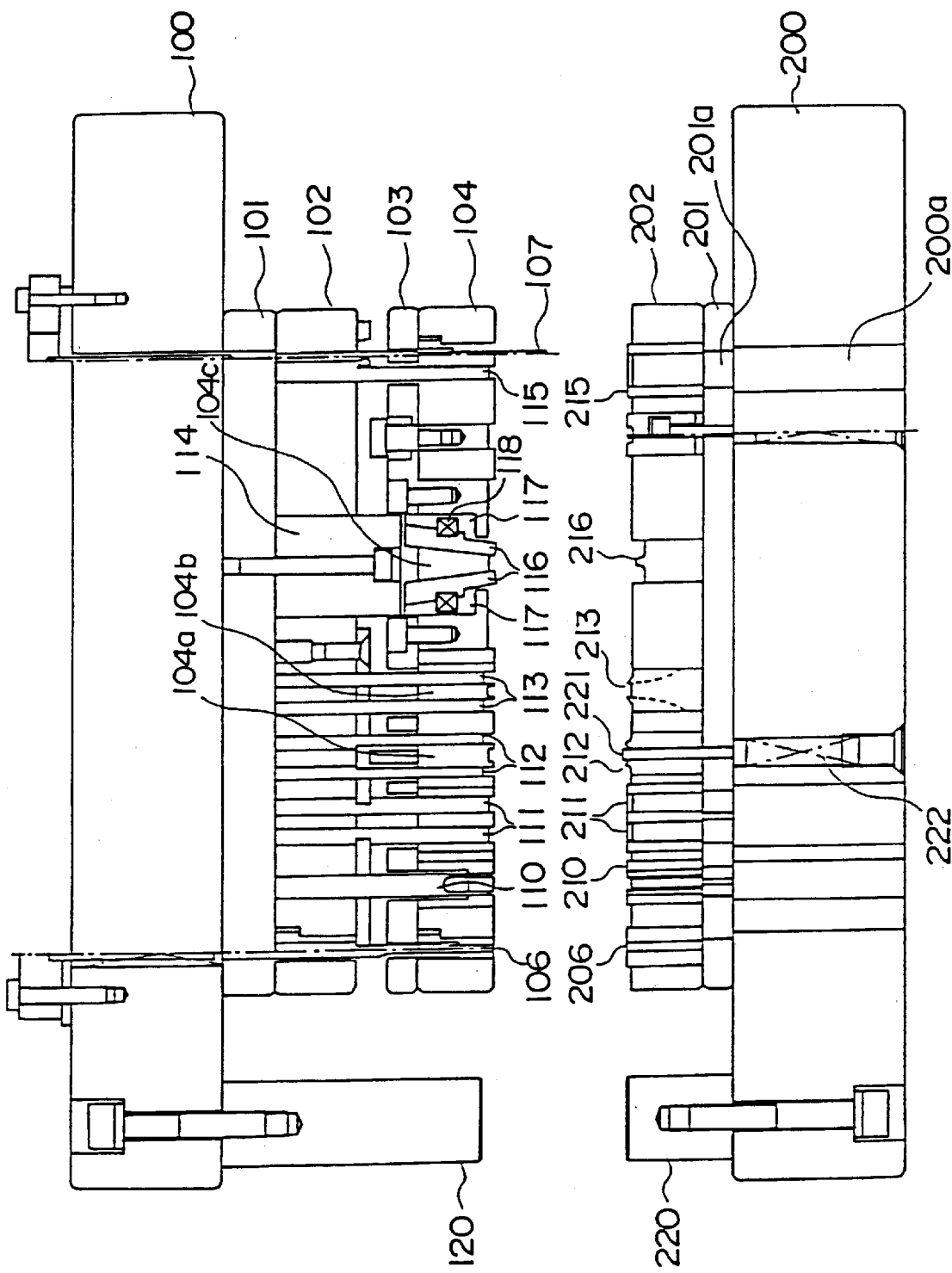
FIG. 1 is a view showing the configuration of a press mold incorporating an apparatus for manufacturing electronic parts according to one embodiment of the present invention.
Figure 6A:
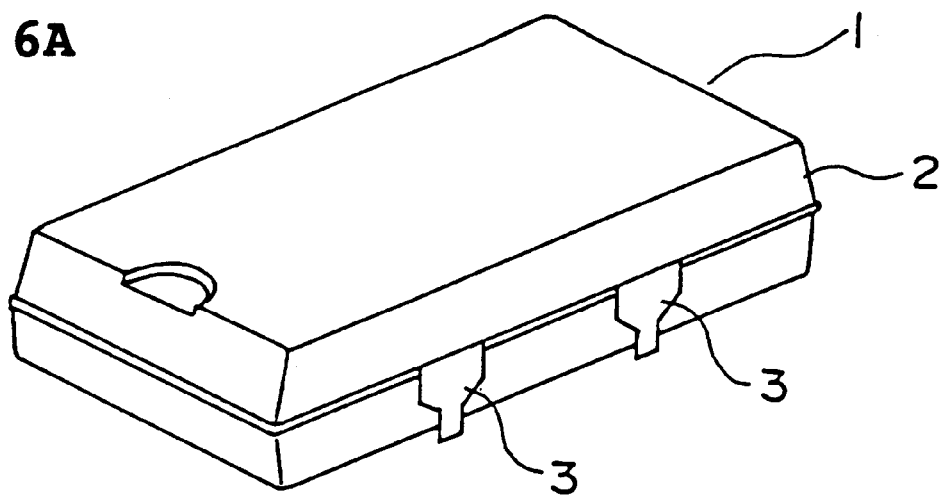
FIGS. 6A and 6B are perspective views of the leads of the quartz oscillator (2) and an explanatory drawing of the leads respectively.
Figure 6B:
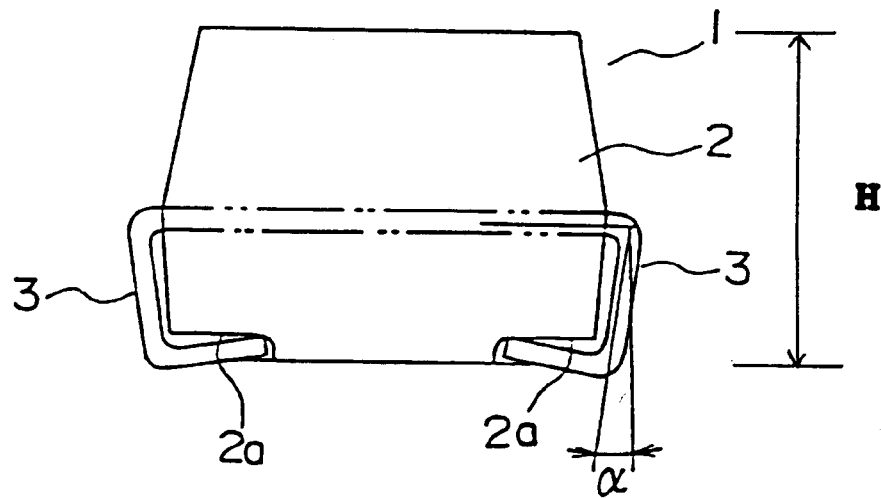
Figure 7:
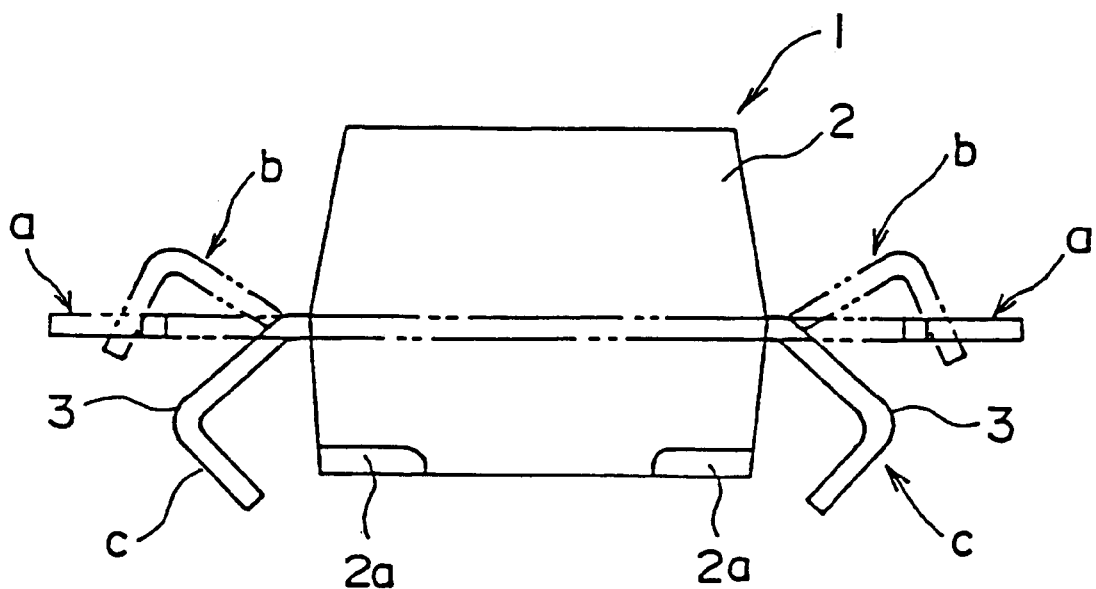
FIG. 7 is a view showing each step carried out in bending the leads of the quartz oscillator.
Figure 8:
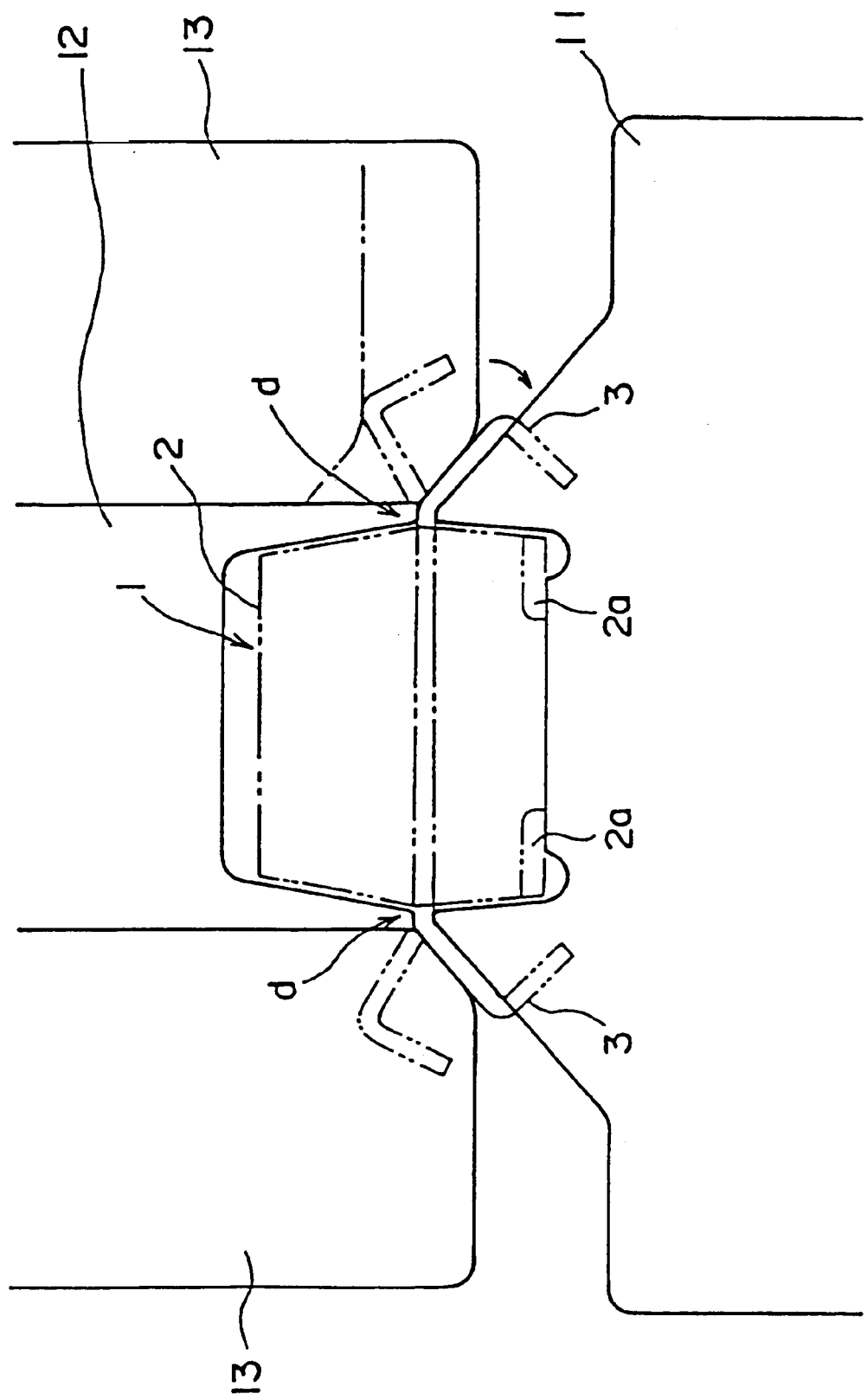
FIG. 8 is an explanatory drawing of the second bending stage that performs the second bending operation on the leads of the quartz oscillator in FIG. 6A.
Figure 9:
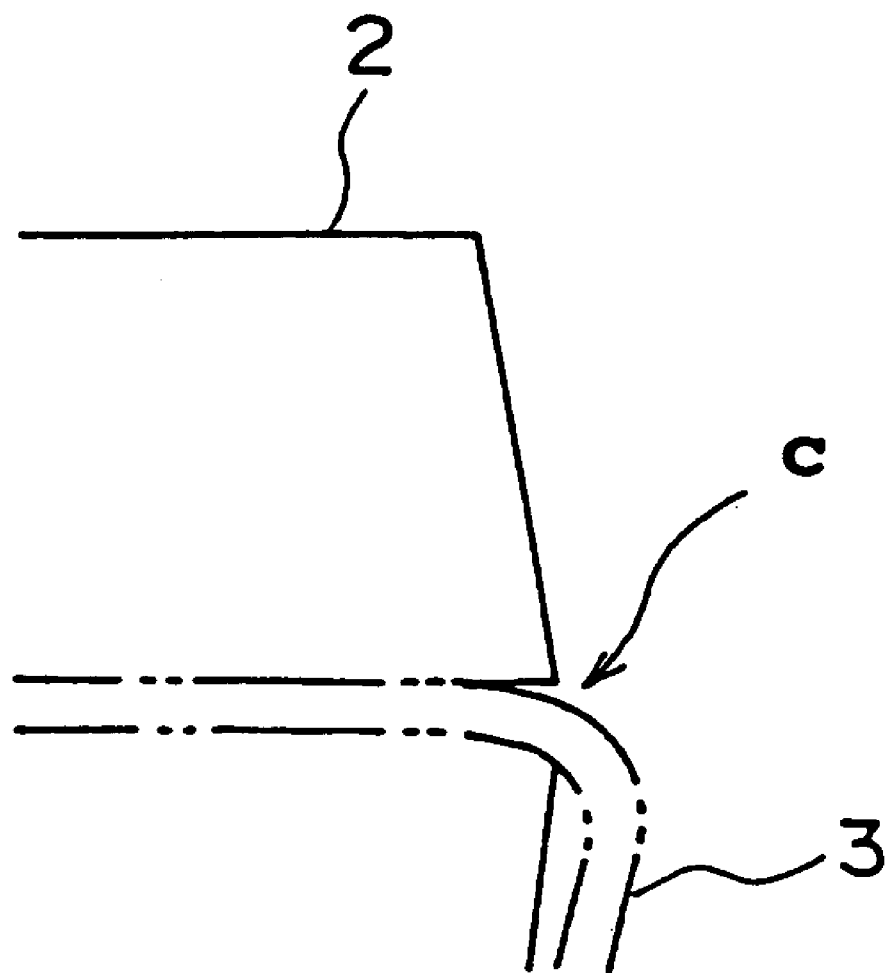
FIG. 9 is an explanatory drawing of a crevice.
Figure 10:
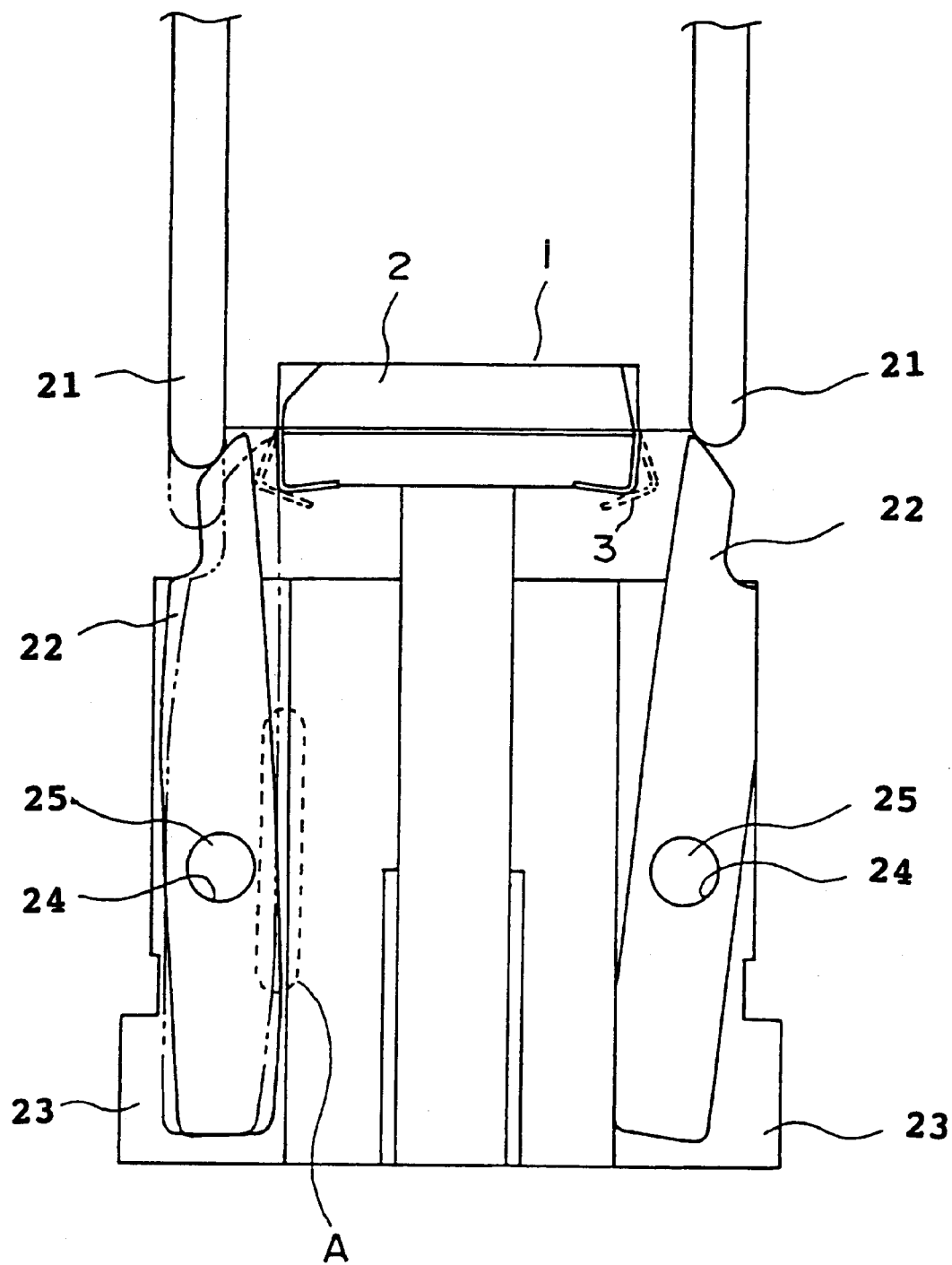
FIG. 10 is an explanatory drawing of the third bending stage that performs the third bending operation on the leads of the quartz oscillator in FIG. 6A.

FIG. 1 is a sectional view showing the configuration of a press mold incorporating an apparatus for manufacturing electronic parts according to one embodiment of the present invention. This press mold comprises a lower mold having a die installed thereon and acting as a lower mold processing section, and an upper mold having a punch and a stripper for fixedly pressing an electric part installed on the die and acting as an upper mold processing section. The press mold manufactures the electronic parts as shown in FIG. 6A by using a guide post (not shown) to guide the upper mold upward and downward, using a lifter (not shown) to lift lead frames from a top surface of the die, and sequentially feeding the lead frames at a predetermined pitch for punching and bending.

In FIG. 1, reference numeral 100 denotes an upper mold die set having an upper mold backing plate 101 mounted on a bottom surface thereof and further having a punch plate 102 mounted on the bottom surface of the upper mold backing plate 101. A stripper plate 104 elastically supported by the upper mold set 100 is located below the punch plate 102 and has a stripper backing plate 103 mounted on a rear surface thereof The stripper plate 104 incorporates stripper pieces for each step, such as a stripper A 104a, a stripper B 104b, and a stripper C 104c.

The upper mold set 100 also has misfeed pins 107 mounted on upstream and downstream sides of processing. On the punch plate 102, a gate cut punch 106, a tie bar cut punch 110, a lead cut punch 111, a bending punch A 112, a bending punch B 113, a cam driver 114, and a pinch cut punch 115 are mounted so as to lie in line from the upstream to downstream side of processing. When the upper mold die set 100 lowers, these components (except the cam driver 114) projects downward through holes formed in the stripper backing plate 103 and stripper plate 104. A bending punch C 116 is located below the cam driver 114 and supported on the stripper plate 104 via a coil spring 118. The upper mold die set 100 also has an upper stripper 120 mounted thereon.

A lower mold die set 200 is located opposite to and below the upper mold die set 100 and has a lower mold backing plate 201 mounted on a top surface thereof and a die plate 202 mounted on the lower mold backing plate 201. On this die plate 202, a gate cut die 206, a tie bar cut die 210, a lead cut die 211, a bending die A 212, a bending die B 213, a bending die C 216, and a pinch cut die 215 are mounted so as to lie in line from the upstream to downstream side of processing. The bending die A 212 is provided in a central portion thereof with an ejector pin 221 elastically supported by a spring 222. The lower mold die set 200 has a lower stopper 220 opposed to the upper stopper 120, and the lower mold backing plate 201 and the die plate 202 have holes (not shown) through which the misfeed pins 107 are inserted during pressing.

An outline of the operation of the press mold in FIG. 1 will be described below.

When the upper mold die set 100 is guided and lowered by the guide post (not shown), the stripper plate 104 first presses a lead frame placed on the die plate 202. The punch plate 102 then lowers and the following pressing process is carried out:

(1) The gate cut punch 106 and the gate cut die 206 perform a pressing operation to cut a gate.

(2) The tie bar cut punch 110 and the tie bar cut die 210 perform a pressing operation to cut a tie bar on the lead frame.

(3) The lead cut punch 111 and the lead cut die 211 perform a pressing operation to cut each of the leads 3 projecting from the resin mold section 2, into a predetermined length.

Figure 2:
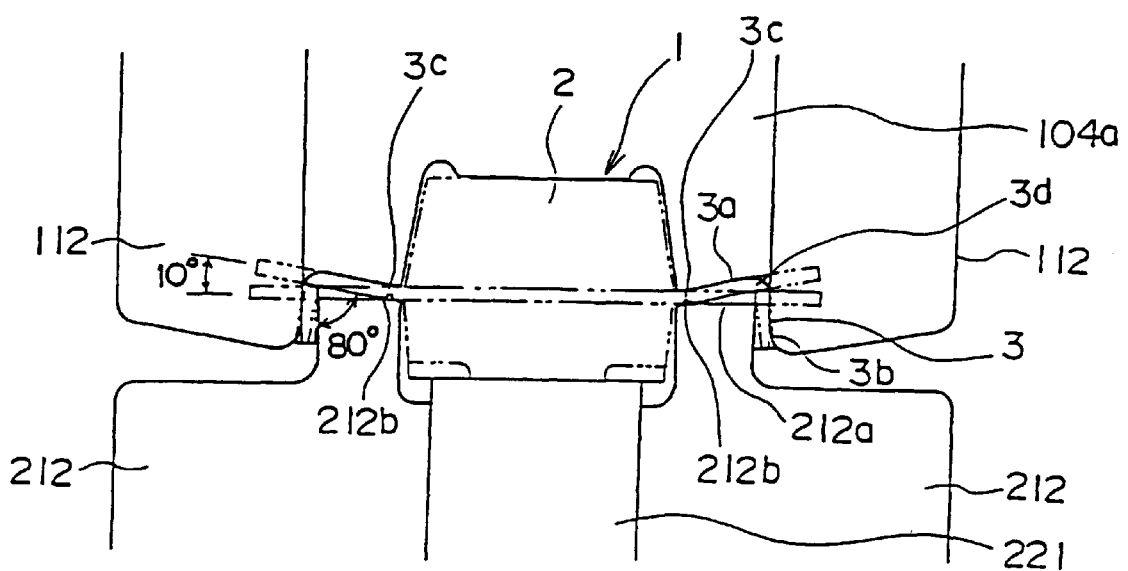
FIG. 2 is an explanatory drawing of a first bending operation in a first bending stage according to the present invention.

(4) A first bending stage comprising the bending punch A 112, the bending die A 212, the stripper A 104*a*, and the ejector pin 221 performs a first bending operation on the lead 3, based on pressing (see FIG. 2).

Figure 3:
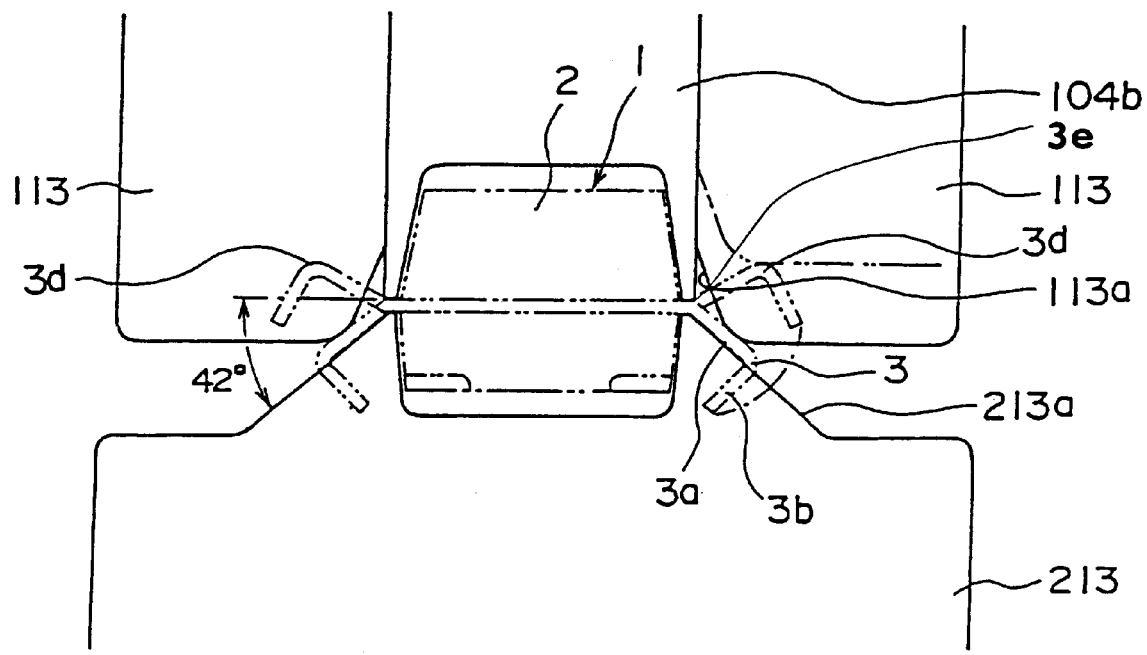
FIG. 3 is an explanatory drawing of a second bending operation in a second bending stage according to the present invention.

(5) A second bending stage comprising the bending punch B 113, the bending die B 213, and the stripper B 104*b* performs a second bending operation on the lead 3, based on pressing (see FIG. 3).

Figure 4:
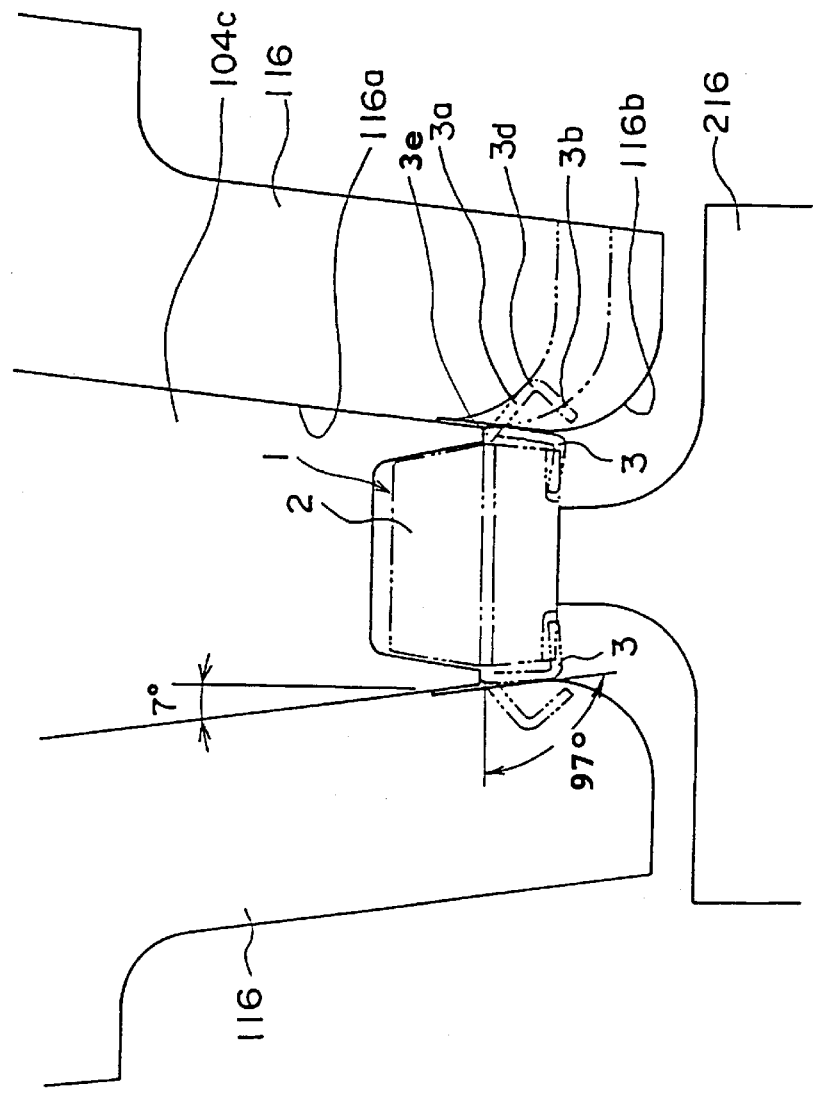
FIG. 4 is an explanatory drawing of a third bending operation in a third bending stage according to the present invention.

(6) A third bending stage comprising the bending punch C 116, the bending die C 216, and the stripper C 104*c* performs a third bending operation on the lead 3, based on pressing (see FIG. 4).

(7) The pinch cut punch 115 and the pinch cut die 215 perform a pressing operation to press a top surface of the resin mold section 2 by the punch 115, cut off the resin mold section 2 with the bent leads 3 from the lead frame, and eject this part downward through a hole 201*a* formed in the lower mold backing plate 201 and through a hole 200*a* formed in the lower die set 200.

The pressing operations (1) to (7) are simultaneously performed, but since the lead frame is sequentially fed from the upstream to downstream sides of processing for each processing operation, the pressing operations (1) to (7) are sequentially performed on each part on the lead frame. The misfeed pins 107 detect the amount of feeding of the lead frame. If the amount of feeding of the lead frame is appropriate, the misfeed pins lower through the holes formed in the lead frame at predetermined intervals. If, however, the amount of feeding of the lead frame is inappropriate, the misfeed pins 107 run into the lead frame. In the latter case, by detecting the amount of movement of the misfeed pins 107, the upper mold die set 100 is stopped from lowering or another processing is carried out to halt the pressing operation. In addition, the opposed upper and lower stoppers 120 and 220 regulate the amount of descent of the upper mold die set 100, that is, of each punch to perform an appropriate pressing operation.

FIG. 2 is an explanatory drawing of the first bending operation in the first bending stage.

The bending die A 212 has an inclined projection 212*a* formed in an area corresponding to a lead piece 3*a* between a base portion and an intermediate portion of each of the leads 3. The projection 212*a* has, on its surface, a projection 212*b* having an inversely V-shaped cross section which is formed in a portion corresponding to the base portion of the lead 3 when setting the quartz oscillator 1 on the ejector pin 221. The projection 212*b* forms an inversely V-shaped groove in an underside of the base portion of the lead 3 and preferably has a height between a half and one third of the board thickness of the lead 3 for an appropriate strength of the lead 3 after bending. The aperture of the V-shaped groove is set such that the V-shaped groove formed in the lead 3 will not be closed after the second bending operation, that is, the vertex of the V shape desirably has an angle between 60° and 90°. The tip of the projection 212*b* is preferably shaped like a curved surface having a radius of curvature of 0.01 mm or larger to prevent the lead 3 from cracking.

In the first bending stage configured as described above, the stripper A 104*a* first lowers before the bending punch A 112 to press the quartz oscillator 1 downward, which has been lifted upward by cause the ejector pin 221, thereby fixedly pressing the lead 3 on the bending die A 212. Thus, the entire lead 3 is slightly bent upward (for example, at about 10°), and at the same time the projection 212*b* provided on a surface of the bending die A 212 cuts into the underside of the base portion of the lead 3 to form an inversely V-shaped groove 3*c*. Then, the bending punch A 112 lowers on the lead 3 fixedly pressed to bend the lead piece 3*b* between the intermediate and tip portions of the lead 3 downward (for example, the lead is bent at 80°) to form a first bent portion 3*d*.

Since the first bending stage performs such an operation, that is, the inversely V-shaped groove 3*c* is formed in the underside of the base portion of the lead 3, a bending position at the next second bending step is set at the position of the V-shaped groove 3*c*, thereby enabling bending at an appropriate position.

FIG. 3 is an explanatory drawing of the second bending operation in the second bending stage.

The bending punch B 113 has an inclined portion 113*a* formed inside to avoid pressing the root portion of the lead 3, which is shaped to press a farther portion of the lead piece 3*a* as far as possible, that is, a neighborhood of the first bent portion 3*d*. The bending die B 213 also has an inclined portion 213*a* corresponding to a bending angle for the lead 3.

In the second bending stage configured as described above, after the quartz oscillator 1 is positioned by the bending die B213 and the stripper B 104*b*, the bending punch B 133 lowers to press a neighborhood of the first bent portion 3*d*. Then, the lead 3 is bent (for example, at 42°) at the position of the V-shaped groove 3*c* formed by the first bending operation, to form a second bent portion 3*e*.

In the second bending stage, the lead 3 is bent at the V-shaped groove 3*c* previously formed in the lead 3 so that a stable bending of the lead 3 at an appropriate position can be obtained. In addition, since the bending punch B 113 is shaped to press the farther side of the lead piece 3*a*, stress exerted on the root of the lead 3 can be reduced. Thus, occurrence of a crevice can be prevented so as to meet the requirement for the height of the quartz oscillator as a result.

FIG. 4 is an explanatory drawing of the third bending operation in the third bending stage. The bending punch C 116 comprises an inner wall 116*a* inclined at a predetermined angle with respect to a vertical direction of the apparatus (in this example, the inner wall 116*a* is inclined, for example, at about 7°). A pair of bending punches C 116 are mutually opposed to form a V shape. In addition, an inner-wall-side tip portion 116*b* of the bending press C116 is shaped like a curved surface, and the curved surface portion at the tip portion 116*b* of the bending punch C 116 is adapted to first come in contact with a neighborhood of the tip portion of the lead piece 3*a*, when pressing.

The third bending operation is so performed that the bending punch C 116 shown in FIG. 4 is driven by means of the cam driver 114 to lower in an oblique direction, press the lead 3 on which the second bending operation shown in FIG. 3 has been performed, and further bend the second bent portion 3e of the lead 3 (the base portion of the lead is bent, for example, at 97°). During the third bending operation, it is difficult to fix the lead 3 by the stripper C 104c and the bending die C 216, since the lead 3 has to be tucked in. However, as the V-shaped groove 3c in the lead 3 has not yet entirely closed and has a certain size of opening remaining even after the second bending operation as described above, the bending position (the second bent portion 3e) is set for the third bending operation, in which the bending die C216 does not contribute to bending, so that bending at an appropriate position can be performed. In addition, the V-shaped groove 3c serves to reduce the stress of the root portion of the lead 3. The projecting length of the bending punch C 116 is so set that a portion of the bending punch, which is brought in contact with the lead 3, does not reach the bent portion obtained in the first bending operation, thereby preventing what is called solder burr (a state where a shaven portion of solder on the lead projects downward from the bent portion obtained in the first bending operation).

The above described operations are performed during the third bending operation. Thus, this operation has the following advantages:

(1) The cam mechanism comprising the cam driver 114 and the bending punch C 116 is all mounted in the upper die, so that it is hardly affected by scraps.

(2) The angle of the inner wall of the bending punch C 116 is set, taking the amount of spring back of the lead 3 into consideration, thereby ensuring bending accuracy.

(3) Since the curved surface portion of the inner-wall-side tip portion of the bending punch C116 has a radius of curvature of 1.5 mm or more and the curved surface portion is so designed as to first come in abutment with a neighborhood of the tip portion of the lead piece 3a, shaving of the soldered surface of the lead 3 is minimized to reduce damage to the lead 3 surface such as a scratch, so that appropriate products can be obtained.

(4) In addition, due to the large sliding surface of the bending punch C 116, replacements of parts caused by abrasion are less frequently required, thereby enabling easy maintenance operations.

(5) Additionally, since this structure requires no lever shaft contrary to cam-lever type in the prior art, no part has an extremely short lifetime, also reducing the frequency of maintenance operations.

Figure 5:
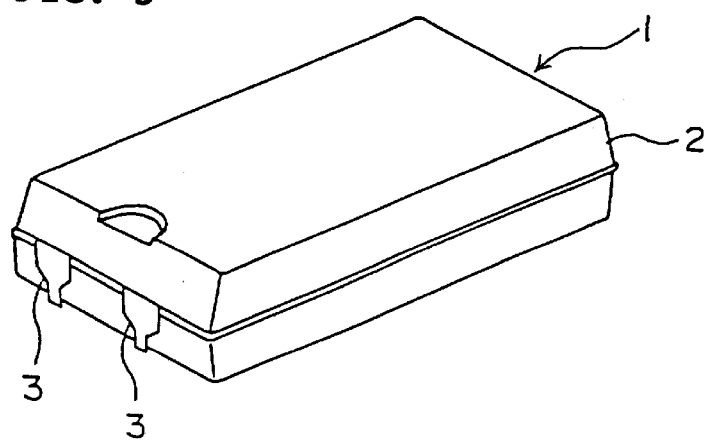
FIG. 5 is a perspective view of leads of a quartz oscillator (1)

In this embodiment, the lead 3 undergoing the bending operations which is provided along a minor axis of the resin mold section 2 as shown in FIG. 6A is explained as an example. However, the lead 3 may be provided at each of the opposite ends in the longitudinal direction as shown in FIG. 5, as a matter of course. In this case, the press mold shown in FIG. 1 has a corresponding layout.

While embodiments of the invention have been illustrated and described, many further alternatives, modifications, applications and variations will be apparent to those skilled in the art in light of the foregoing description. Thus, the invention described herein is intended to embrace all such alternatives, modifications, applications and variations as may fall within the spirit and scope of the appended claims.

What is claimed is:

1. A method for manufacturing an electronic part that includes a resin mold section, a built-in electronic element and at least one lead projecting therefrom, the method comprising the steps of:

bending a first portion of each lead to form a first bent portion while simultaneously inclining that lead upward in a neighborhood of a root thereof and forming a V-shaped groove near the root of that lead;

bending a second portion, near the V-shaped groove, of each lead to form a second bent portion; and pressing each lead from obliquely above to bend that lead with the first bent portion so that a tip portion of that lead is located at a bottom portion of the resin mold section.

2. The method according to claim 1, wherein the electronic part is a quartz oscillator.

3. The method according to claim 1, wherein the first bent portion is formed between the tip portion and an intermediate portion of the corresponding lead.

4. The method according to claim 1, wherein the second bent portion is formed near the root of the corresponding lead.

5. The method according to claim 1, wherein the V-shaped groove of each lead is formed to have a depth of between about one-third and about one-half of a board thickness of the corresponding lead.

6. The method according to claim 1, wherein each lead is bent so as not close the corresponding V-shaped groove.

7. An apparatus for manufacturing an electronic part that includes a resin mold section, a built-in electronic element and at least one lead projecting therefrom, the apparatus comprising:

a first bending punch for bending a first portion of each lead to form a first bent portion;

a first bending die formed in a fashion corresponding to the first bending punch;

a second bending punch for bending a second portion, which is different from the first portion, of each lead to form a second bent portion;

a second bending die located in a fashion corresponding to the second bending punch; and a third bending punch for pressing each lead from obliquely above to bend that lead in such a manner that a tip portion of that lead having the first and second bent portions is located at a bottom portion of the resin mold section;

wherein the first bending punch bends the first portion of each lead while the first bending die inclines that lead upward in a neighborhood of a root thereof and simultaneously forms a V-shaped groove near the root of that lead.

8. The apparatus according to claim 7, wherein the first bending punch and the first bending die are arranged so that the first bent portion is formed between the tip portion and an intermediate portion of the corresponding lead.

9. The apparatus according to claim 7, wherein the second bending punch and the second bending die are arranged so as to form the second bent portion near a root of the corresponding lead.

10. The apparatus according to claim 7, wherein the third bending punch has a curved surface portion brought in contact with a lead section.

11. The apparatus according to claim 7, wherein the first bending die has a projection formed therein for forming a V-shaped groove in the root of the corresponding lead.

12. The apparatus according to claim 11, wherein the projection has a height set between about one-third and about one-half of a thickness of the corresponding lead.

13. The apparatus according to claim 11, wherein the projection is formed so that its vertex has an angle between 60° and 90°.

14. The apparatus according to claim 7, wherein the first and second bending dies are formed to contact at least partly with a neighborhood of the root of the lead.

15. The apparatus according to claim 7, further comprising a cam driver for driving the third bending punch.

16. The apparatus according to claim 7, wherein the third bending punch has a surface inclined at a predetermined angle with respect to a vertical direction.

17. The apparatus according to claim 7, wherein the third bending punch is provided in a stripper plate via a spring member.

18. The apparatus according to claim 7, wherein each of the bending punches and each of the bending dies are formed so as to bend leads formed in a major axis direction of the electronic part.

19. The apparatus according to claim 7, wherein each of the bending punches and each of the bending dies are formed so as to bend leads formed in a minor axis direction of the electronic part.

20. The apparatus according to claim 7, wherein the first bending die has a projection to form the V-shaped groove, the projection comprising a vertex having an angle set between about 60° and about 90°.

* * * * *